(12) United States Patent
Copty et al.

(10) Patent No.: US 10,915,436 B2
(45) Date of Patent: Feb. 9, 2021

(54) SYSTEM LEVEL TEST GENERATION USING DNN TRANSLATION FROM UNIT LEVEL TEST

(71) Applicant: International Business Machines Corporation, Armonk, NY (US)

(72) Inventors: Fady Copty, Nazareth (IL); Karen Yorav, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 16/214,048

(22) Filed: Dec. 8, 2018

(65) Prior Publication Data

US 2020/0183816 A1    Jun. 11, 2020

(51) Int. Cl.
| | |
|---|---|
| *G06F 9/44* | (2018.01) |
| *G06F 11/36* | (2006.01) |
| *G06N 20/00* | (2019.01) |
| *G06F 30/20* | (2020.01) |

(52) U.S. Cl.
CPC ...... *G06F 11/3688* (2013.01); *G06F 11/3696* (2013.01); *G06F 30/20* (2020.01); *G06N 20/00* (2019.01)

(58) Field of Classification Search
CPC .. G06F 11/3688; G06F 11/3696; G06N 20/00
USPC ......................................................... 717/124
See application file for complete search history.

(56) References Cited

U.S. PATENT DOCUMENTS

| | | | | |
|---|---|---|---|---|
| 8,387,016 | B2 * | 2/2013 | Tillmann ............ | G06F 11/3684 717/124 |
| 8,510,715 | B1 * | 8/2013 | Ormandy ............ | G06F 11/3676 717/124 |
| 8,578,344 | B2 * | 11/2013 | Godefroid ............... | G06F 21/51 717/131 |

(Continued)

FOREIGN PATENT DOCUMENTS

| | | | | |
|---|---|---|---|---|
| CN | 108171064 | | 6/2018 | |
| WO | WO-2019157046 A1 * | | 8/2019 | .......... G06F 11/3684 |

OTHER PUBLICATIONS

Daniel Flemstrom et al. "SAGA toolbox: Interactive Testing of Guarded Assertions"; 10th IEEE International Conference on Software Testing, Verification and Validation—2017 IEEE.*

(Continued)

*Primary Examiner* — Francisco J Aponte
(74) *Attorney, Agent, or Firm* — Gregory J. Kirsch

(57) ABSTRACT

Embodiments of the present systems and methods may provide techniques that may provide unit-level test of an SUT, but which translates the unit-level test into a valid test of the SUT itself. For example, in an embodiment, a computer-implemented method for testing a system, the method may comprise analyzing the system to determine sub-components of the system and inputs to the sub-components, performing dynamic testing of the system and collecting pairs of inputs to the system and inputs to the sub-components, training a machine learning model to translate from inputs to the sub-components to inputs to the system input using the collected pairs of inputs to the system and inputs to the sub-components and performing sub-component level testing and translating the sub-component level testing to system level testing.

17 Claims, 4 Drawing Sheets

(56) References Cited

U.S. PATENT DOCUMENTS

| | | | | |
|---|---|---|---|---|
| 8,745,592 | B1* | 6/2014 | Ormandy | G06F 11/3676 |
| | | | | 717/126 |
| 8,819,834 | B2* | 8/2014 | Petrica | G06F 21/577 |
| | | | | 726/25 |
| 8,868,976 | B2* | 10/2014 | Ben-Yehuda | G06F 11/263 |
| | | | | 714/25 |
| 8,924,938 | B2 | 12/2014 | Chang et al. | |
| 9,015,667 | B2* | 4/2015 | Meijer | G06F 11/076 |
| | | | | 717/124 |
| 9,098,621 | B2* | 8/2015 | Zheng | G06F 11/3612 |
| 10,218,740 | B1* | 2/2019 | Mesdaq | H04L 63/145 |
| 10,387,655 | B2* | 8/2019 | Copty | G06F 21/577 |
| 10,713,151 | B1* | 7/2020 | Zinger | G06F 11/3676 |
| 2009/0164975 | A1* | 6/2009 | Natanov | G06F 11/3688 |
| | | | | 717/127 |
| 2011/0302455 | A1* | 12/2011 | Thomas | G06F 11/3636 |
| | | | | 714/45 |
| 2011/0314454 | A1* | 12/2011 | Godefroid | G06F 11/3676 |
| | | | | 717/131 |
| 2014/0047275 | A1* | 2/2014 | Eddington | G06F 11/0766 |
| | | | | 714/37 |
| 2015/0026669 | A1* | 1/2015 | Eddington | G06F 21/577 |
| | | | | 717/137 |
| 2016/0253563 | A1* | 9/2016 | Lam | G06F 11/0748 |
| | | | | 348/130 |
| 2017/0212829 | A1 | 7/2017 | Bales et al. | |
| 2017/0329687 | A1 | 11/2017 | Chorley et al. | |
| 2018/0285186 | A1* | 10/2018 | Godefroid | G06N 3/0472 |
| 2018/0365139 | A1* | 12/2018 | Rajpal | G06F 11/3688 |
| 2019/0089722 | A1* | 3/2019 | Ciocarlie | H04L 67/22 |
| 2019/0109872 | A1* | 4/2019 | Dhakshinamoorthy | |
| | | | | G06F 21/577 |
| 2019/0196952 | A1* | 6/2019 | Manchiraju | G06F 11/3676 |
| 2019/0197243 | A1* | 6/2019 | Hendrickx | G06F 21/577 |

OTHER PUBLICATIONS

Morteza Zakeri Nasrabadi et al. "Format-aware Learn&Fuzz: Deep Test Data Generation for Efficient Fuzzing"; Iran University of Science and Technology, Tehran, Iran—May 29, 2019.*

Christof Budnik et al. "Guided Test Case Generation Through AI Enabled Output Space Exploration"; 2018 ACM/IEEE 13th International Workshop on Automation of Software Test; AST'18, May 28-29, 2018, Gothenburg, Sweden.*

Rena'ta Hodova'n et al.; "Fuzzinator: An Open-Source Modular Random Testing Framework"—2018 IEEE 11th International Conference on Software Testing, Verification and Validation.*

Ciprian Paduraru et al.; "An Automatic Test Data Generation Tool using Machine Learning"—In Proceedings of the 13th International Conference on Software Technologies (ICSOFT 2018), pp. 472-481.*

Tewodros Legesse Munea et al.; "Network protocol fuzz testing for information systems and applications: a survey and taxonomy" Multimed Tools Appl (2016) 75:14745-14757—Published online: Aug. 2, 2015.*

Daniel Kraus, "Machine Learning and Evolutionary Computing for GUI-based Regression Testing", arXiv, Feb. 11, 2018.

Ur et al., "Micro Architecture Coverage Directed Generation of Test Programs", DAC '99 Proceedings of the 36th annual ACM/IEEE Design Automation Conference, pp. 175-180.

Charalambos Ioannides et al., "Coverage Directed Test Generation automated by Machine Learning", ACM Transactions on Design Automation of Electronic Systems (TODAES) TODAES Homepage archive, vol. 17, Issue 1, Jan. 2012.

* cited by examiner

SYSTEM LEVEL TEST GENERATION USING DNN TRANSLATION FROM UNIT LEVEL TEST

BACKGROUND

The present invention relates to techniques that provide unit-level test of an SUT, but which translates the unit-level test into a valid test of the SUT itself.

The problem of finding security vulnerabilities in input-processing code has been challenging the testing community for a very long time. One of the main methodologies is to divide the problem into smaller sub-problems by decomposing the system-under-test (SUT) into smaller units (sub-components) and then testing each unit as a standalone. This method solves many scalability issues, but introduces a new problem as it can find vulnerabilities in units that are not reachable in the SUT setup. These findings may be false positives and therefore may be ignored, or they may be valid issues and must be fixed. Valid issues are those in which the system level test triggers the same checker/assertion that was triggered by the unit level test. Thus, a valid unit-level test indicates a problem an actual problem with the SUT.

Accordingly, a need arises for techniques that provide unit-level test of an SUT, but which translates the unit-level test into a valid test of the SUT itself.

SUMMARY

Embodiments of the present systems and methods may provide techniques that may provide unit-level test of an SUT, but which translates the unit-level test into a valid test of the SUT itself. In essence, embodiments may translate from a "unit level test that triggers an assertion" to a "system level test that triggers the same assertion. For example, for given an SUT, unit, and a unit-level test that triggers an assertion, embodiments may translate this unit-level test into an SUT level test.

Embodiments of the present systems and methods may leverage deep neural networks (DNN) to learn a translation of unit-level tests into system level tests. This may be done by running a number of simulation techniques and collecting pairs of inputs to the system and to the unit. Then, a DNN may be trained to translate from unit level into system level. The given test may be translated using this DNN. Genetic simulation may be run on a system level and may use this test as a starting point. Periodically, the training and translation may be repeated as the test corpus expands.

For example, in an embodiment, a computer-implemented method for testing a system, implemented in a computer comprising a processor, memory accessible by the processor, and computer program instructions stored in the memory and executable by the processor, the method may comprise analyzing the system to determine sub-components of the system and inputs to the sub-components, performing dynamic testing of the system and collecting pairs of inputs to the system and inputs to the sub-components, training a machine learning model to translate from inputs to the sub-components to inputs to the system input using the collected pairs of inputs to the system and inputs to the sub-components and performing sub-component level testing and translating the sub-component level testing to system level testing.

In embodiments, the dynamic testing may comprise at least one of fuzzing, generation, concolic, simulation, and emulation. The system may comprise at least one of call-graph analysis and taint analysis. The method may further comprise performing genetic fuzz simulation on the system to generate new pairs of inputs to the system and inputs to the sub-components. The method may further comprise retraining the machine learning model using the newly generated pairs of inputs to the system and inputs to the sub-components. Performing genetic fuzz simulation and retraining the machine learning model is performed periodically. At least one sub-component comprises at least one level of sub-component, and testing is performed on at least one pair of levels of sub-component.

In an embodiment, a system for testing a system may comprise a processor, memory accessible by the processor, and computer program instructions stored in the memory and executable by the processor to perform: analyzing the system to determine sub-components of the system and inputs to the sub-components, performing dynamic testing of the system and collecting pairs of inputs to the system and inputs to the sub-components, training a machine learning model to translate from inputs to the sub-components to inputs to the system input using the collected pairs of inputs to the system and inputs to the sub-components and performing sub-component level testing and translating the sub-component level testing to system level testing.

In an embodiment, a computer program product for testing a system may comprise a non-transitory computer readable storage having program instructions embodied therewith, the program instructions executable by a computer, to cause the computer to perform a method comprising: analyzing the system to determine sub-components of the system and inputs to the sub-components, performing dynamic testing of the system and collecting pairs of inputs to the system and inputs to the sub-components, training a machine learning model to translate from inputs to the sub-components to inputs to the system input using the collected pairs of inputs to the system and inputs to the sub-components and performing sub-component level testing and translating the sub-component level testing to system level testing.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION

Embodiments of the present systems and methods may provide techniques that may provide unit-level test of an SUT, but which translates the unit-level test into a valid test of the SUT itself. For example, for given an SUT, unit, and a unit-level test that triggers an assertion, embodiments may translate this unit-level test into an SUT level test. It is to be noted that embodiments of the present systems and methods may be applicable to hardware and software testing. For example, embodiments of the present systems and methods may be applicable to any type of software testing, such as security testing, functionality testing, reliability testing, verification testing, etc., and may translate a unit level software test into a system level software test. Further, embodiments of the present systems and methods may be applicable to any type of hardware testing, such as security testing, functionality testing, reliability testing, verification testing, etc., by translating a unit level hardware test into a system level hardware test.

Embodiments of the present systems and methods may leverage machine learning processes, such as deep neural networks (DNN) or any other machine learning processes to learn a translation of unit-level tests into system level tests. Although, for clarity, the use of s DNN is described herein, embodiments may utilize any machine learning process. This may be done by running a number of simulation techniques and collecting pairs of inputs to the system and to the unit. Then, a DNN may be trained to translate from unit level into system level. The given test may be translated using this DNN. Genetic simulation may be run on a system level and may use this test as a starting point. Periodically, the training and translation may be repeated as the test corpus expands.

Figure 1:
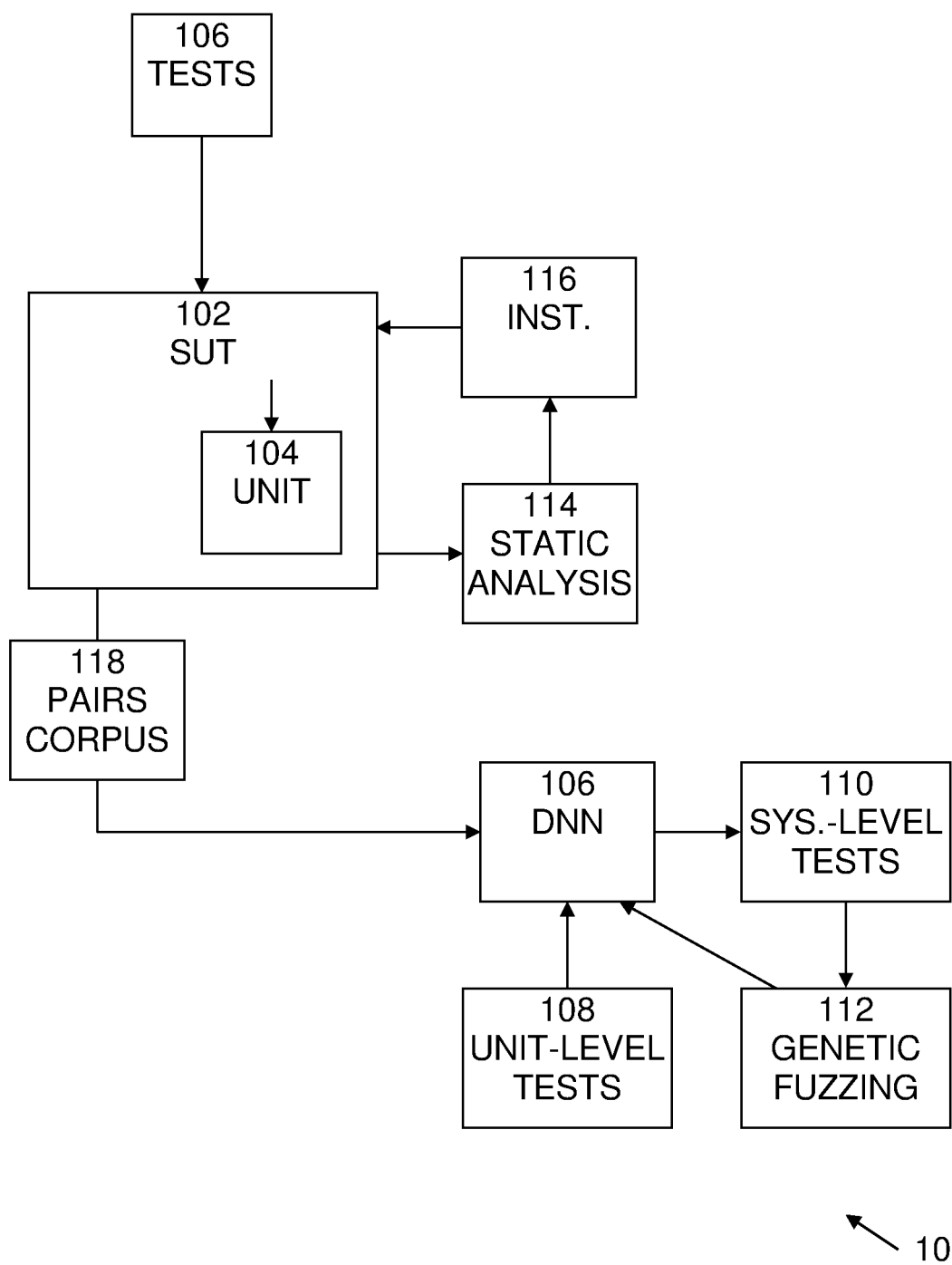
FIG. 1 illustrates an exemplary block diagram of a processing system according to embodiments of the present systems and methods.

An exemplary block diagram of a processing system 100 according to embodiments of the present systems and methods is shown in FIG. 1. In this example, a system under test 102 may include a unit under test 104. One or more tests 106 may be applied to unit 104. A deep neural network 106 may be trained and used to translate unit level tests 108 to SUT-level tests 110. Genetic simulation (fuzzing) 112 may be run on a system level and may use this test as a starting point.

Figure 2:
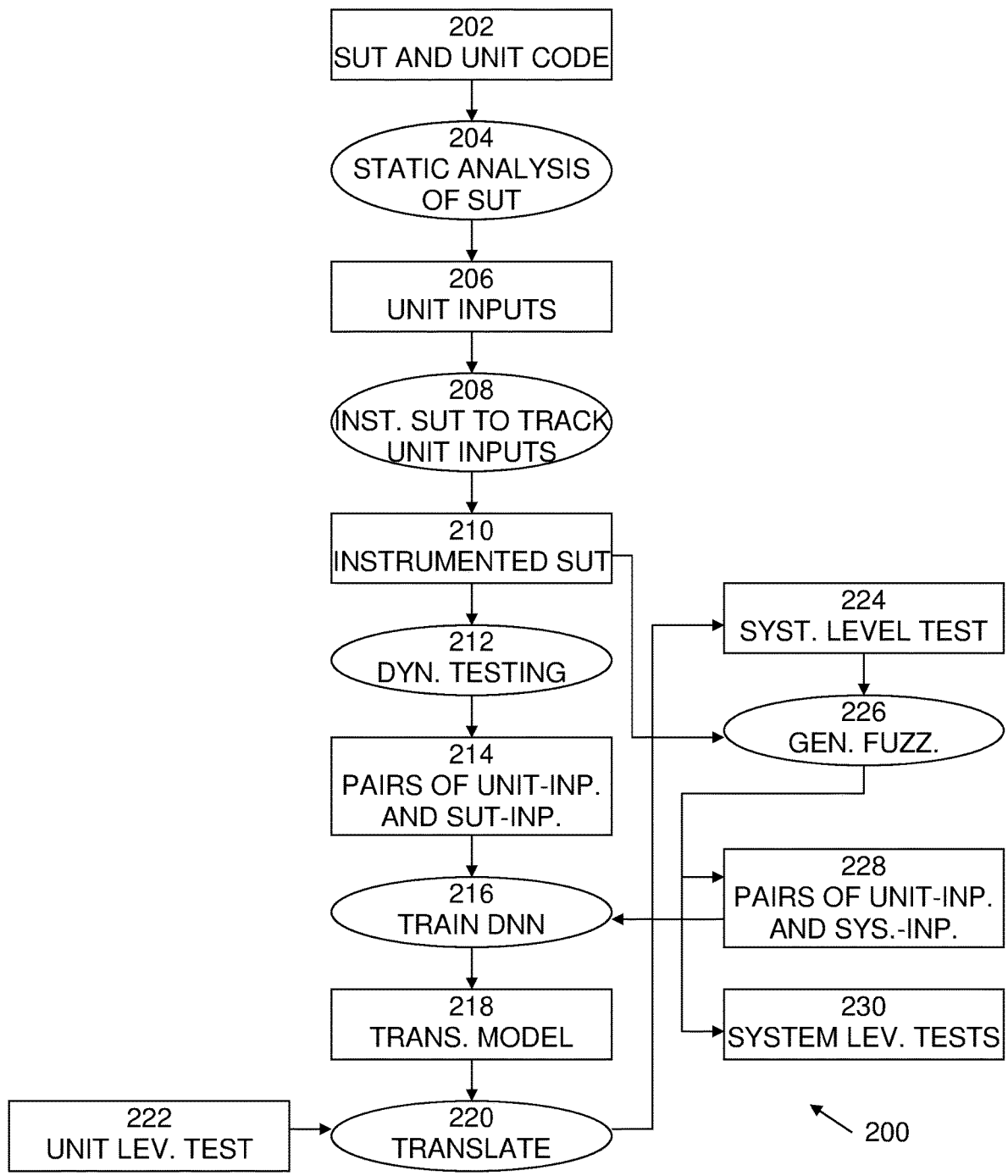
FIG. 2 is an exemplary flow diagram of a process according to embodiments of the present techniques.

An exemplary flow diagram of a process 200, according to embodiments of the present techniques, is shown in FIG. 2. It is best viewed in conjunction with FIG. 1. Process 200 begins with 202, in which the software code or hardware circuitry for the SUT 102 and for the unit 104 being analyzed are provided and the "interesting" input to the unit is discovered. For example, the interface to the unit may be marked as interesting input. At 204, static analysis 114, such as call-graph analysis, taint analysis, etc., may be run on the code to discover environment level inputs to the unit and to output the discovered inputs 206 to the unit.

At 208, the system-level code may be instrumented 210, 116 such that the discovered inputs 206 to the unit may be tracked during run time. At 212, dynamic testing of the SUT, such as fuzzing, generation, concolic, simulation, emulation, etc., may be run while collecting a large corpus of pairs 118 of SUT-inputs and unit-inputs 214. At 216, a deep neural network may be trained to form a translation model 218 to translate from unit-input to SUT-input 224 using the corpus 214 collected so far. At 220, one or more unit-level tests 222, 108 may be translated to system level tests 224, 110 using the DNN translation model 218.

A 226, genetic fuzz simulation 112 may be run on the SUT using the translated input 224, 110 as a starting point for the genetic algorithm. Fuzzing is an automated way of testing hardware or software by providing random data as input. The fuzzed input typically may include both common and uncommon input sequences, in order to trigger exceptional behavior in the hardware or software, such as crashes, memory leaks and failing assertions. In a genetic fuzzer, genetic programming may be used to guide the fuzzer in generating uncommon inputs that may trigger exceptional behavior. Thus, genetic fuzz testing 226 may generate new pairs of unit-inputs and SUT-inputs 228 and system level test 230. The new pairs of unit-inputs and SUT-inputs 228 may be used to conduct additional training 216 of DNN translation model 218. The additional training may be conducted periodically, with a convenient or useful period, or may be conducted when conditions indicate new training is warranted, such as when the test corpus reaches new coverage.

Figure 3:
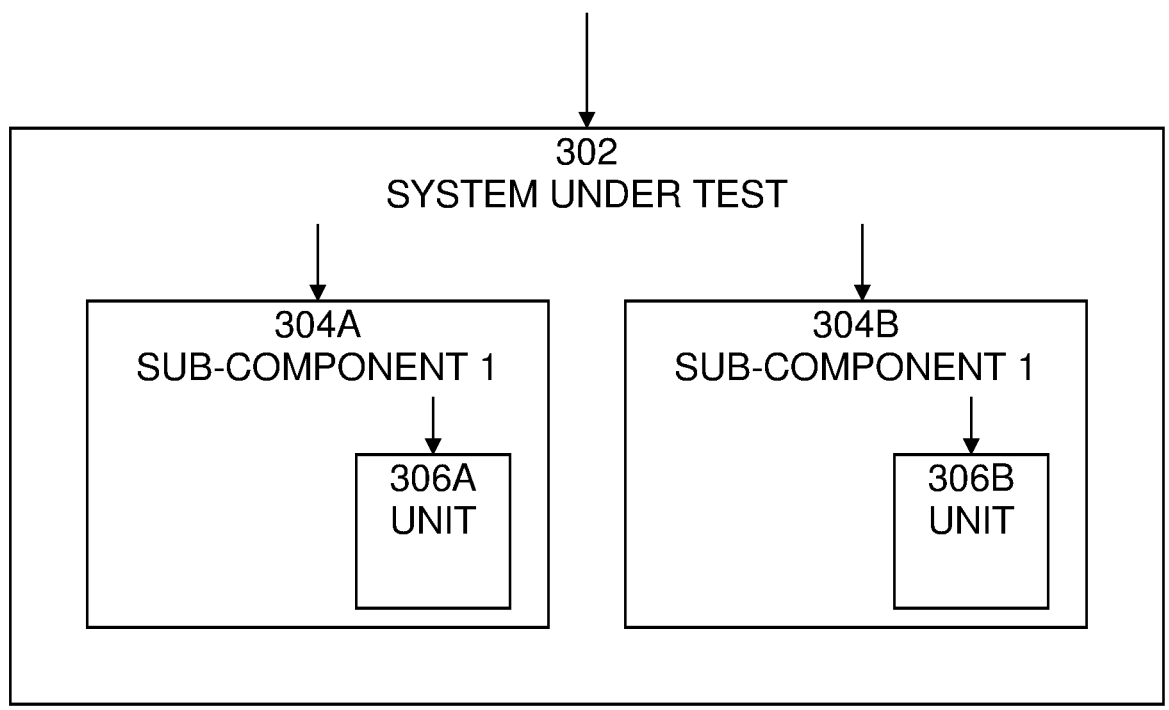
FIG. 3 is an exemplary block diagram of an embodiment of the present systems and methods.

An exemplary block diagram of an embodiment 300 of the present systems and methods is shown in FIG. 3. In this example, verification of SUT 302 may be broken down into more levels of sub-components 304A, 304B and units 306A, 306B, and verification processing according to, for example, process 200 may be performed for each pair of levels.

In embodiments, if multiple instances of a unit exist, then data may be collected from all instances of the unit or by randomly picking only one unit instance to collect data from. In embodiments, if multiple instances of a unit exist, then the verification may be broken down into more levels of sub-components so that only one instance of each unit is present in each subcomponent.

In embodiments, the translation model may be leveraged for test generation by, for example, feeding the input layer with random numbers, running an adversary DNN on the input layer, and extracting internal filter activations as mutations for genetic fuzzing.

Embodiments may automatically break the SUT verification problem into more levels of sub-components, and perform the above for each pair of levels. If multiple instances of a particular unit or sub-component exist, then embodiments may randomly pick only one unit to collect data from, embodiments may collect data from all units, or embodiments may break the problem into more levels of subcomponents where this problem does not occur. In embodiments, the present systems and methods may be used to solve different problems. For example, embodiments may leverage the translation model for test generation of the SUT by feeding the input layer with random numbers, running adversary DNN fuzzing, and extracting internal filter activations as mutation for genetic fuzzing. To increase efficiency and accuracy, embodiments may define a finite set of sequences of inputs at the unit and at the system level (a number of cycles, a transaction, API invocation, etc.). The learning objective may be posed as learning the correspondence between finite words over a finite alphabet. The learning process may then be fine-tuned by modifying the sizes of the alphabets (increasing performance at the expense of accuracy).

Embodiments of the present systems and methods may solve the problem of translating sub-component test to system level test. For example, when a vulnerability is found in a library—embodiments may recreate the vulnerability it in a system that uses this library. A test may be found in a unit using formal methods, and may be recreated in a system where formal methods are not effective Embodiments of the present systems and methods may utilize machine learning techniques. For example, embodiments may leverage DNN technologies to translate tests from one language-space to another, not merely learns relationships between coverage to test. Genetic testing techniques may be limited by the initial input received. Embodiments may provide techniques to create new initial inputs to genetic testing techniques.

Embodiments of the present systems and methods may utilize components such as testing and static analysis techniques, machine learning techniques, such as Supervised Learning techniques, for example, DNNs. Embodiments may apply learning to the problem of providing unit-level test of an SUT, and translating the unit-level test into a valid test of the SUT itself. Embodiments may automatically break the SUT into sub-units and apply the solution in stages. Likewise, embodiments may leverage the translation model for test generation.

Figure 4:
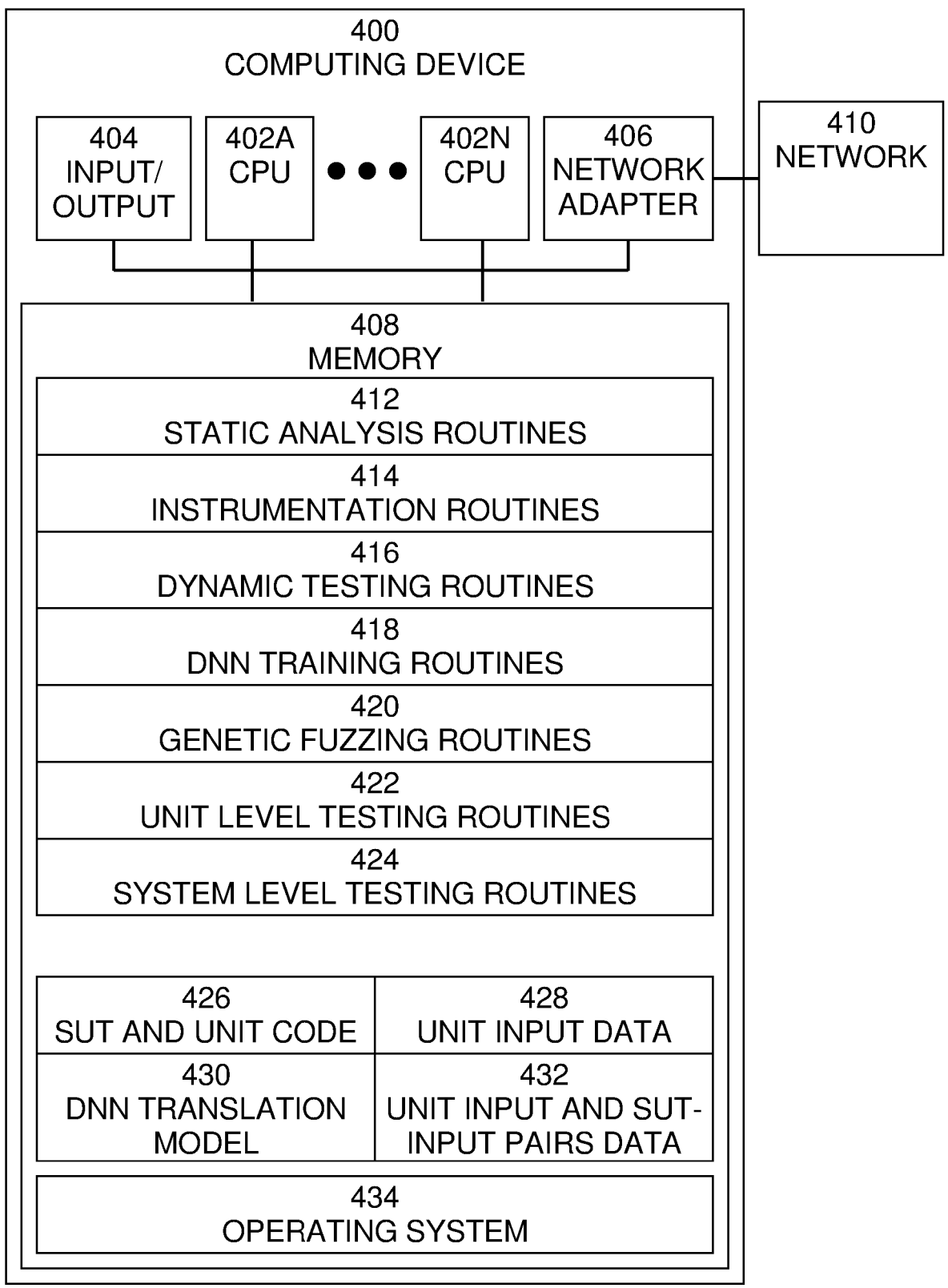
FIG. 4 is an exemplary block diagram of a computer system, in which processes involved in the embodiments described herein may be implemented.

An exemplary block diagram of a computer system 402, in which processes involved in the embodiments described herein may be implemented, is shown in FIG. 4. Computer system 402 may be implemented using one or more programmed general-purpose computer systems, such as embedded processors, systems on a chip, personal computers, workstations, server systems, and minicomputers or mainframe computers, or in distributed, networked computing environments. Computer system 402 may include one or more processors (CPUs) 402A-402N, input/output circuitry 404, network adapter 406, and memory 408. CPUs 402A-402N execute program instructions in order to carry out the functions of the present communications systems and methods. Typically, CPUs 402A-402N are one or more microprocessors, such as an INTEL CORE® processor. FIG. 4 illustrates an embodiment in which computer system 402 is implemented as a single multi-processor computer system, in which multiple processors 402A-402N share system resources, such as memory 408, input/output circuitry 404, and network adapter 406. However, the present communications systems and methods also include embodiments in which computer system 402 is implemented as a plurality of networked computer systems, which may be single-processor computer systems, multi-processor computer systems, or a mix thereof.

Input/output circuitry 404 provides the capability to input data to, or output data from, computer system 402. For example, input/output circuitry may include input devices, such as keyboards, mice, touchpads, trackballs, scanners, analog to digital converters, etc., output devices, such as video adapters, monitors, printers, etc., and input/output devices, such as, modems, etc. Network adapter 406 interfaces device 400 with a network 410. Network 410 may be any public or proprietary LAN or WAN, including, but not limited to the Internet.

Memory 408 stores program instructions that are executed by, and data that are used and processed by, CPU 402 to perform the functions of computer system 402. Memory 408 may include, for example, electronic memory devices, such as random-access memory (RAM), read-only memory (ROM), programmable read-only memory (PROM), electrically erasable programmable read-only memory (EEPROM), flash memory, etc., and electro-mechanical memory, such as magnetic disk drives, tape drives, optical disk drives, etc., which may use an integrated drive electronics (IDE) interface, or a variation or enhancement thereof, such as enhanced IDE (EIDE) or ultra-direct memory access (UDMA), or a small computer system interface (SCSI) based interface, or a variation or enhancement thereof, such as fast-SCSI, wide-SCSI, fast and wide-SCSI, etc., or Serial Advanced Technology Attachment (SATA), or a variation or enhancement thereof, or a fiber channel-arbitrated loop (FC-AL) interface.

The contents of memory 408 may vary depending upon the function that computer system 402 is programmed to perform. In the example shown in FIG. 4, exemplary memory contents are shown representing routines and data for embodiments of the processes described above. However, one of skill in the art would recognize that these routines, along with the memory contents related to those routines, may not be included on one system or device, but rather may be distributed among a plurality of systems or devices, based on well-known engineering considerations. The present communications systems and methods may include any and all such arrangements.

In the example shown in FIG. 4, memory 408 may include static analysis routines 412, instrumentation routines 414, dynamic testing routines 416, DNN training routines 418, genetic fuzzing routines 420, unit level testing routines 422, system level testing routines 424, SUT and unit code under test 426, unit input data 428, DNN translation model 430, unit input and SUT input pair data 432, and operating system 434. Static analysis routines 412 may include software routines to perform analysis such as call-graph analysis, taint analysis, etc., to discover environment level inputs to the units and to output the discovered inputs to the units as unit input data 428. Instrumentation routines 414 may include software routines to instrument the system-level code such that the discovered inputs to the unit may be tracked during run time. Dynamic testing routines 416 may include software routines to perform dynamic testing of the SUT, such as fuzzing, generation, concolic, simulation, emulation, etc., which may be run while collecting a pairs of SUT-inputs and unit-inputs, which may be stored as SUT input pair data 432. DNN training routines 418 may include software routines to train a deep neural network to form a translation model to translate from unit-input to SUT-input. The trained model may be stored as DNN translation model 430. Genetic fuzzing routines 420 may include software routines to perform genetic fuzz simulation on the SUT using the translated input as a starting point for the genetic algorithm, as an automated way of testing the software by providing random data as input. Unit level testing routines 422 may include software routines to perform unit-level testing. System level testing routines 424 may include software routines to perform system-level testing. SUT and unit code under test 426 may include the software code of the system under test and the included units under test. Operating system 434 may provide overall system functionality.

As shown in FIG. 4, the present communications systems and methods may include implementation on a system or systems that provide multi-processor, multi-tasking, multi-process, and/or multi-thread computing, as well as implementation on systems that provide only single processor, single thread computing. Multi-processor computing involves performing computing using more than one processor. Multi-tasking computing involves performing computing using more than one operating system task. A task is an operating system concept that refers to the combination of a program being executed and bookkeeping information used by the operating system. Whenever a program is executed, the operating system creates a new task for it. The task is like an envelope for the program in that it identifies the program with a task number and attaches other bookkeeping information to it. Many operating systems, including Linux, UNIX®, OS/2®, and Windows®, are capable of running many tasks at the same time and are called multi-tasking operating systems. Multi-tasking is the ability of an operating system to execute more than one executable at the same time. Each executable is running in its own address space, meaning that the executables have no way to share any of their memory. This has advantages, because it is impossible for any program to damage the execution of any of the other programs running on the system. However, the programs have no way to exchange any information except through the operating system (or by reading files stored on the file system). Multi-process computing is similar to multi-tasking computing, as the terms task and process are often used interchangeably, although some operating systems make a distinction between the two.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A computer-implemented method for testing a system, implemented in a computer comprising a processor, memory accessible by the processor, and computer program instructions stored in the memory and executable by the processor, the method comprising:
analyzing the system to determine sub-components of the software system and inputs to the sub-components;
performing dynamic testing of the system using random data as input and collecting pairs of inputs to the software system and inputs to the sub-components, wherein each pair comprises an input to a sub-component that triggers an assertion and an input to the software system that that triggers the same assertion;
training a machine learning model to translate from inputs to the sub-components to inputs to the system input using the collected pairs of inputs to the software system and inputs to the sub-components as training data, wherein the machine learning model is trained by defining a finite set of sequences of inputs for each sub-component and for the system software system, including at least one of a number of cycles, a transaction, and an API invocation, learning a correspondence between finite words over a finite alphabet, and fine-tuning the training by modifying sizes of alphabets;
using the machine learning model to generate testing data for dynamic testing of the system by feeding an input layer of the machine learning model with random numbers, running adversary Deep Neural Network fuzzing, and extracting internal filter activations as mutation for genetic fuzzing; and
performing sub-component level testing and translating the sub-component level testing to system level testing using the trained machine learning model, wherein at least one sub-component comprises at least one level of sub-component, and testing is performed on at least one pair of levels of sub-component.

2. The method of claim 1, wherein the system under test comprises one of a hardware system or a software system.

3. The method of claim 2, wherein the dynamic testing comprises at least one of fuzzing, generation, concolic, simulation, and emulation.

4. The method of claim 3, further comprising performing genetic fuzz simulation on the system to generate new pairs of inputs to the system and inputs to the sub-components.

5. The method of claim 4, further comprising:
retraining the machine learning model using the newly generated pairs of inputs to the system and inputs to the sub-components.

6. The method of claim 5, wherein performing genetic fuzz simulation and retraining the machine learning model is performed periodically.

7. A system for testing a system, the system comprising a processor, memory accessible by the processor, and computer program instructions stored in the memory and executable by the processor to perform:
analyzing the system to determine sub-components of the software system and inputs to the sub-components;
performing dynamic testing of the system using random data as input and collecting pairs of inputs to the software system and inputs to the sub-components, wherein each pair comprises an input to a sub-component that triggers an assertion and an input to the software system that that triggers the same assertion;
training a machine learning model to translate from inputs to the sub-components to inputs to the system input using the collected pairs of inputs to the software system and inputs to the sub-components as training data, wherein the machine learning model is trained by defining a finite set of sequences of inputs for each sub-component and for the system software system, including at least one of a number of cycles, a transaction, and an API invocation, learning a correspondence between finite words over a finite alphabet, and fine-tuning the training by modifying sizes of alphabets;
using the machine learning model to generate testing data for dynamic testing of the system by feeding an input layer of the machine learning model with random numbers, running adversary Deep Neural Network fuzzing, and extracting internal filter activations as mutation for genetic fuzzing; and
performing sub-component level testing and translating the sub-component level testing to system level testing using the trained machine learning model, wherein at least one sub-component comprises at least one level of sub-component, and testing is performed on at least one pair of levels of sub-component.

8. The system of claim 7, wherein the system under test comprises one of a hardware system or a software system.

9. The system of claim 8, wherein the dynamic testing comprises at least one of fuzzing, generation, concolic, simulation, and emulation.

10. The system of claim 9, further comprising performing genetic fuzz simulation on the system to generate new pairs of inputs to the system and inputs to the sub-components.

11. The system of claim 10, further comprising:
retraining the machine learning model using the newly generated pairs of inputs to the system and inputs to the sub-components.

12. The system of claim 11, wherein performing genetic fuzz simulation and retraining the machine learning model is performed periodically.

13. A computer program product for testing a system, the computer program product comprising a non-transitory computer readable storage having program instructions embodied therewith, the program instructions executable by a computer, to cause the computer to perform a method comprising:
analyzing the system to determine sub-components of the software system and inputs to the sub-components;
performing dynamic testing of the system using random data as input and collecting pairs of inputs to the software system and inputs to the sub-components, wherein each pair comprises an input to a sub-component that triggers an assertion and an input to the software system that that triggers the same assertion;
training a machine learning model to translate from inputs to the sub-components to inputs to the system input using the collected pairs of inputs to the software system and inputs to the sub-components as training data, wherein the machine learning model is trained by defining a finite set of sequences of inputs for each sub-component and for the system software system, including at least one of a number of cycles, a transaction, and an API invocation, learning a correspondence between finite words over a finite alphabet, and fine-tuning the training by modifying sizes of alphabets;

using the machine learning model to generate testing data for dynamic testing of the system by feeding an input layer of the machine learning model with random numbers, running adversary Deep Neural Network fuzzing, and extracting internal filter activations as mutation for genetic fuzzing; and performing sub-component level testing and translating the sub-component level testing to system level testing using the trained machine learning model, wherein at least one sub-component comprises at least one level of sub-component, and testing is performed on at least one pair of levels of sub-component.

14. The computer program product of claim 13, wherein the system under test comprises one of a hardware system or a software system.

15. The computer program product of claim 14, wherein the dynamic testing comprises at least one of fuzzing, generation, concolic, simulation, and emulation.

16. The computer program product of claim 15, further comprising performing genetic fuzz simulation on the system to generate new pairs of inputs to the system and inputs to the sub-components.

17. The computer program product of claim 16, further comprising:

retraining the machine learning model using the newly generated pairs of inputs to the system and inputs to the sub-components; and performing genetic fuzz simulation and retraining the deep neural network periodically.

\* \* \* \* \*